(12) United States Patent
Kim et al.

(10) Patent No.: US 7,494,926 B2
(45) Date of Patent: Feb. 24, 2009

(54) METHOD FOR FORMING HIGHLY CONDUCTIVE METAL PATTERN ON FLEXIBLE SUBSTRATE AND EMI FILTER USING METAL PATTERN FORMED BY THE METHOD

(75) Inventors: Jin Young Kim, Gyeonggi-Do (KR); Sung Hen Cho, Seoul (KR); Ki Yong Song, Seoul (KR); Chang Ho Noh, Gyeonggi-Do (KR); Euk Che Hwang, Gyeonggi-Do (KR)

(73) Assignee: Samsung Corning Co., Ltd., Suwon-Si, Gyeonggi-Do (KR)

( * ) Notice: Subject to any disclaimer, the term of this patent is extended or adjusted under 35 U.S.C. 154(b) by 50 days.

(21) Appl. No.: 11/014,703

(22) Filed: Dec. 20, 2004

(65) Prior Publication Data

US 2006/0019076 A1    Jan. 26, 2006

(30) Foreign Application Priority Data

Jul. 20, 2004    (KR) .................. 10-2004-0056317

(51) Int. Cl.
*H01L 21/44*    (2006.01)
(52) U.S. Cl. ............. 438/677; 438/641; 257/E21.575
(58) Field of Classification Search ........ 438/641, 438/677; 257/E21.575
See application file for complete search history.

(56) References Cited

U.S. PATENT DOCUMENTS

| | | | | |
|---|---|---|---|---|
| 5,576,073 | A * | 11/1996 | Kickelhain | 427/555 |
| 5,908,497 | A * | 6/1999 | Morfesis et al. | 106/287.18 |
| 6,066,359 | A * | 5/2000 | Yao et al. | 427/126.3 |
| 6,500,589 | B1 * | 12/2002 | Ohtsu et al. | 430/7 |
| 7,067,237 | B2 * | 6/2006 | Kim et al. | 430/315 |
| 7,205,096 | B2 * | 4/2007 | Park et al. | 430/311 |
| 7,205,098 | B2 * | 4/2007 | Cho et al. | 430/321 |
| 7,338,752 | B2 * | 3/2008 | No et al. | 430/315 |
| 2004/0079941 | A1 * | 4/2004 | Yamazaki et al. | 257/40 |
| 2005/0003242 | A1 * | 1/2005 | No et al. | 428/701 |
| 2005/0023957 | A1 * | 2/2005 | Kim et al. | 313/495 |
| 2006/0019182 | A1 * | 1/2006 | Lee et al. | 430/7 |
| 2006/0037177 | A1 * | 2/2006 | Blum et al. | 23/296 |
| 2006/0105251 | A1 * | 5/2006 | Hwang et al. | 430/7 |

(Continued)

FOREIGN PATENT DOCUMENTS

DE    19910482 A1 *    5/2000

(Continued)

*Primary Examiner*—Michelle Estrada
*Assistant Examiner*—Jarrett J Stark
(74) *Attorney, Agent, or Firm*—Buchanan Ingersoll & Rooney PC

(57) ABSTRACT

Disclosed herein is a method for forming a highly conductive metal pattern which comprises forming a metal pattern on a substrate by the use of a photocatalyst and a selective electroless or electroplating process, and transferring the metal pattern to a flexible plastic substrate. According to the method, a highly conductive metal pattern can be effectively formed on a flexible plastic substrate within a short time, compared to conventional formation methods. Further disclosed is an EMI filter comprising a metal pattern formed by the method. The EMI filter not only exhibits high performances, but also is advantageous in terms of low manufacturing costs and simple manufacturing process. Accordingly, the EMI filter can be applied to a variety of flat panel display devices, including PDPs and organic ELs.

18 Claims, 1 Drawing Sheet

U.S. PATENT DOCUMENTS

| | | | |
|---|---|---|---|
| 2006/0127818 A1* | 6/2006 | Cho et al. | 430/321 |
| 2006/0144713 A1* | 7/2006 | Song et al. | 205/118 |
| 2006/0183061 A1* | 8/2006 | Hwang et al. | 430/324 |
| 2007/0027015 A1* | 2/2007 | Zhou et al. | 501/17 |
| 2007/0181878 A1* | 8/2007 | Song et al. | 257/59 |
| 2008/0044559 A1* | 2/2008 | Noh et al. | 427/145 |

FOREIGN PATENT DOCUMENTS

| | | |
|---|---|---|
| JP | 2001291721 A * | 10/2001 |
| KR | 5-16281 | 1/1993 |
| KR | 10-72676 | 3/1998 |
| KR | 10-278800 | 10/1998 |
| KR | 2000-323890 | 11/2000 |
| KR | 2001-168574 | 6/2001 |
| KR | 10-2003-0030110 | 4/2003 |

* cited by examiner

METHOD FOR FORMING HIGHLY CONDUCTIVE METAL PATTERN ON FLEXIBLE SUBSTRATE AND EMI FILTER USING METAL PATTERN FORMED BY THE METHOD

BACKGROUND OF THE DISCLOSURE

Priority under 35 U.S.C. 119(a) is claimed to Korean Patent Application No. 2004-56317, filed on Apr. 20, 2004, which is herein incorporated by reference.

FIELD OF THE DISCLOSURE

The present disclosure relates to a method for forming a highly conductive metal pattern on a flexible substrate and an electromagnetic interference filter (hereinafter, abbreviated as "EMI filter") using a metal pattern formed by the method. More particularly, the present disclosure relates to a method for forming a highly conductive metal pattern which comprises forming a metal pattern on a glass- or Si-based substrate by the use of a photocatalyst (the terms "photocatalyst" and "photocatalytic compound" are used interchangeably herein) and a selective electroless or electro-plating process, and transferring the metal pattern to an adhesive-treated flexible plastic substrate; and an EMI filter comprising a metal pattern formed by the method.

DESCRIPTION OF THE RELATED ART

Since it has recently been found that some electromagnetic waves might be harmful to humans, regulatory guidelines on shielding of electromagnetic waves in the fields of electronic devices and their related industries have been increasingly stringent around the world. In recent years, with drastically increasing demand for various display devices, including plasma display panels used as wall-mounted televisions, studies on techniques for shielding static electricity and potentially harmful electromagnetic waves emitted from the display devices are actively being undertaken.

For example, Japanese Patent Laid-open No. Hei 10-278800 discloses a method for forming a transparent electrode on a display plane of a screen by a sputtering or deposition process. This method has problems in that the transmittance is very poor when sufficient electromagnetic wave shielding effects are provided, and vice-versa. At this time, the formation of a film having a thickness between 100 Å and 2,000 Å is required in order to ensure the transmittance of visible light emitted from Plasma Display Panel (PDP) devices. However, within this range of the film thickness, electromagnetic wave shielding effects are unsatisfactory.

Further, Japanese Patent Laid-open No. 2000-323890 describes a method for forming a mesh pattern by coating an adhesive agent layer-laminated conductive film on a transparent substrate, forming a pattern on the conductive film using a photoresist or a printable resist material, and metal-etching the pattern. However, this method has problems of high manufacturing costs and additional need for a near-infrared film required to operate remote controllers for household electronic products.

As alternative examples, Japanese Patent Laid-open Nos. Hei 5-16281 and 10-72676 disclose a method for manufacturing a material for an electromagnetic wave shielding film by laminating a transparent resin layer on a transparent substrate, e.g., a polycarbonate substrate, electroless copper plating the resin layer, and forming a mesh pattern thereon by an etching process, e.g., microphotolithography. Although this method is advantageous for easy treatment of the metal thin film, there is the disadvantage that the composition of the etching solution, etching temperature and etching time are difficult to manage upon etching by photolithography.

On the other hand, Japanese Patent Laid-open No. 2001-168574 suggests a method for forming a mesh pattern which does not involve etching. According to this method, a transparent resin coating film containing reducing metal particles served as a catalyst of the electroless plating is laminated on a transparent substrate, the catalyst present at an opening portion formed on a mesh pattern is deactivated or contacted with a processing agent for dissolution/removal, an electromagnetic wave or electronic beam is irradiated thereto, and finally only the catalyst portion is subjected to electroless plating to form an electromagnetic wave shielding film on the mesh pattern. However, the method involves the use of additional processes, e.g., the catalyst present at the opening portion must be deactivated by an inkjet process, or the pattern must be formed using a photoresist before deactivation. Accordingly, the overall procedure is still complicated despite the absence of etching process.

Thus, there exists a need in the art for a method for forming a highly conductive metal pattern wherein the metal pattern can be rapidly and efficiently formed in a simple manner without the necessity of additional processes, e.g., a process for forming a metal thin film requiring high vacuum and high temperature conditions, or an exposure process for forming a fine pattern and a subsequent etching process. There is also a need for a method for forming a metal pattern which can be used to manufacture a high-performance EMI filter.

To satisfy these needs in the art, the present inventors have suggested a method for forming a metal pattern comprising the steps of coating a photocatalytic compound on a substrate, selectively exposing the coated substrate to form a latent pattern acting as a nucleus for crystal growth thereon by photoreaction, and plating the latent pattern to grow metal crystals thereon (Korean Patent Application No. 2003-30110). In the case where a highly conductive metal pattern, e.g., a copper pattern, is directly formed on a glass- or Si-based substrate, the adhesion between the metal pattern and the substrate is poor, resulting in peeling of the metal pattern. Accordingly, a nickel layer having superior adhesion to the substrate must be formed before formation of the copper pattern.

On the other hand, a metal pattern may be directly formed on a flexible plastic substrate. However, since the metal pattern has a weaker adhesion to the plastic substrate than to a glass- or Si-based substrate, annealing is required to improve the adhesion between the plastic substrate and the metal pattern. Moreover, the annealing temperature is, however, limited to 200° C. or less, which makes it difficult to directly form a highly adhesive metal pattern on the plastic substrate.

SUMMARY OF THE DISCLOSURE

Therefore, the present disclosure has been made in view of the above problems of the prior art, and it is an object of the present disclosure to provide a method for rapidly and efficiently forming a highly conductive metal pattern on a flexible substrate in a simple manner, and a high performance EMI filter manufactured using a metal pattern formed by the method.

It is another object of the present disclosure to provide a method for forming a highly adhesive metal pattern on a flexible plastic substrate, and a high performance EMI filter manufactured using a metal pattern formed by the method.

It is yet another object of the present disclosure to provide a method for forming a highly conductive metal pattern by forming a metal pattern on a substrate using a photocatalyst film and transferring the metal pattern to a flexible plastic substrate wherein the photocatalyst film remaining on the substrate after transfer of the metal pattern to the flexible plastic substrate can be recycled, thereby saving resources and shortening the overall procedure, and an EMI filter using a metal pattern formed by the method.

Therefore it is a feature of the present disclosure to provide a method for forming a highly conductive metal pattern on a flexible plastic substrate, comprising the steps of: forming a latent pattern acting as a nucleus for crystal growth on a substrate, and growing metal crystals on the latent pattern by plating to form a metal pattern; and transferring the metal pattern to an adhesive-treated flexible plastic substrate.

It is another feature of the present disclosure to provide a method for forming a highly conductive metal pattern by forming a metal pattern on a substrate using a photocatalyst and transferring the metal pattern to a flexible plastic substrate wherein the photocatalyst film remaining on the substrate after transfer of the metal pattern to the flexible plastic substrate can be recycled, thereby shortening the overall procedure and reducing the costs of formation.

In accordance with the features of the present disclosure, there is provided an EMI filter using a metal pattern formed by the method.

In accordance with the features of the present disclosure, there is provided a flat panel display device comprising the EMI filter formed by the method.

BRIEF DESCRIPTION OF THE DRAWINGS

The above and other objects, features and other advantages of the present disclosure will be more clearly understood from the following detailed description taken in conjunction with the accompanying drawing, in which.

DESCRIPTION OF THE PREFERRED EMBODIMENTS

Figure 1:
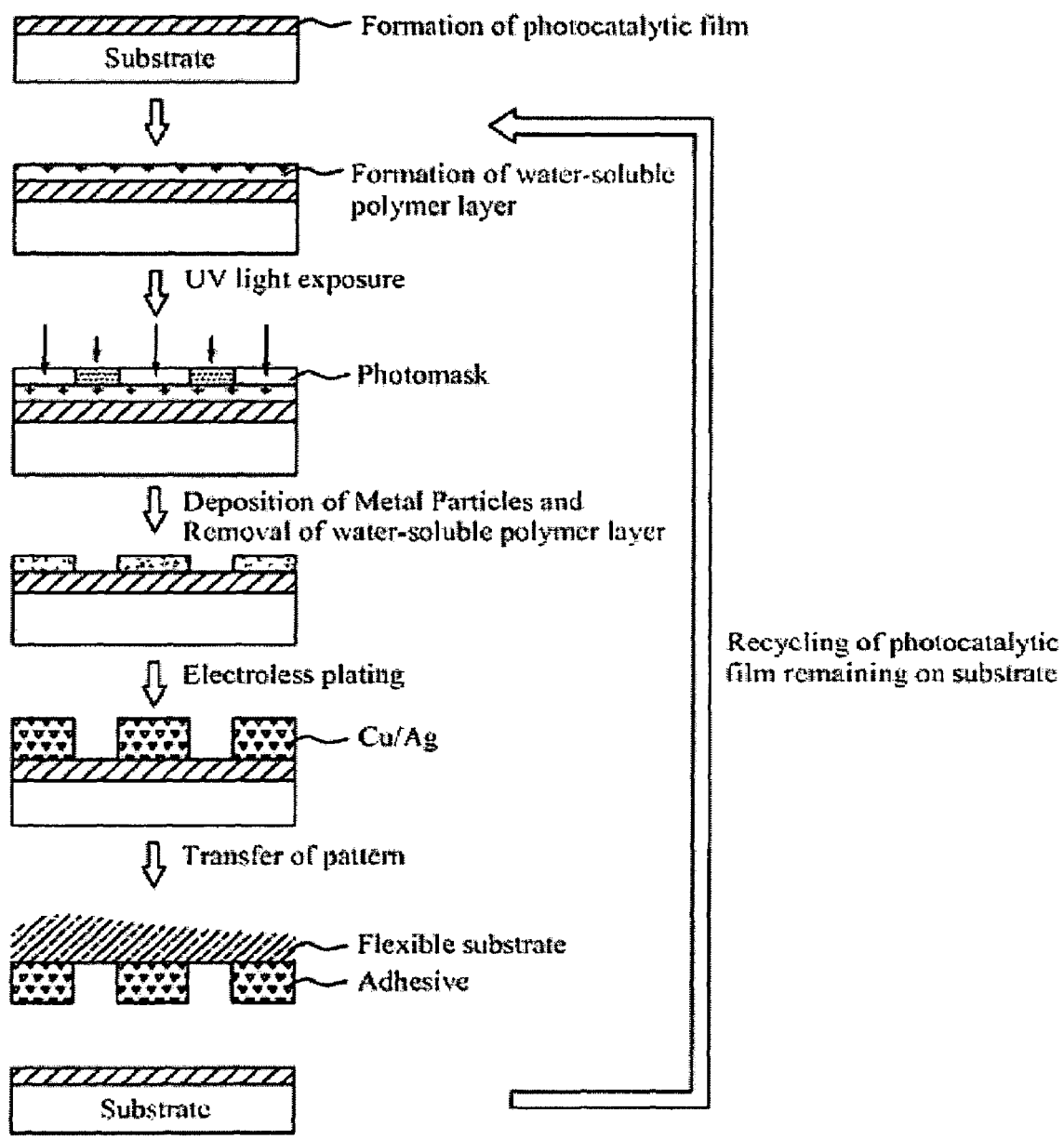
FIG. 1 is an exemplary diagram illustrating the steps of a method for forming a highly conductive metal pattern on a flexible substrate in accordance with one embodiment of the present disclosure.

The present disclosure will now be described in more detail with reference to the accompanying drawing.

In accordance with the present disclosure, a highly conductive metal pattern is formed on a flexible plastic substrate by the following procedure. First, a latent pattern acting as a nucleus for crystal growth is formed on the substrate, and then metal crystals are grown on the latent pattern by plating to form a metal pattern. The metal pattern thus formed is transferred to an adhesive-treated plastic substrate.

Meanwhile, the step of forming a metal pattern on the substrate includes the sub-steps of coating a photocatalytic compound on the substrate to form a photocatalytic film (a first sub-step), selectively exposing the photocatalytic film to light to form a latent pattern acting as a nucleus for crystal growth (a second sub-step), and growing metal crystals on the latent pattern by plating the latent pattern to form a metal pattern (a third sub-step).

Hereinafter, the present disclosure will be explained in more detail, based on the respective steps.

1. Step 1: Formation of Metal Pattern i) The First Sub-Step: Formation of Photocatalytic Film FIG. 1 is an exemplary diagram illustrating the steps of the method for forming a highly conductive metal pattern on a flexible substrate in accordance with one embodiment of the present disclosure. Also, structures of respective layers formed through the steps are shown in FIG. 1. Referring to FIG. 1, a photocatalytic compound is coated on the substrate to form a film of the photocatalytic compound (hereinafter, referred to as "photocatalytic film").

The term "photocatalytic compound" as used herein refers to a compound whose characteristics are drastically changed by light. The photocatalytic compound is inactive when not exposed to light, but its reactivity is accelerated upon being exposed to light, e.g., UV light. In addition, the photocatalytic compound is electron-excited by photoreaction upon light exposure, thus exhibiting a reducing ability. Preferred examples of the photocatalytic compounds are Ti-containing organometallic compounds which can form $TiO_x$ (in which x is 0, 1 or 2) after coating and annealing. Specific examples of Ti-containing organometallic compounds include tetraisopropyl titanate, tetra-n-butyl titanate, tetrakis (2-ethylhexyl) titanate, and polybutyl titanate.

The coating thickness of the photocatalytic film is preferably in the range between 30 nm and 1,000 nm. After coating, the coated substrate is heated on a hot plate or in a microwave at 200° C. or below for 20 minutes or less to form a transparent photocatalytic film layer. If the heating is carried out at a temperature exceeding 200° C., a crystalline $TiO_2$ layer may be formed, deteriorating the optical properties.

In this step, a water-soluble polymeric compound may be coated on the Ti-containing organic compound layer to form a photocatalyst layer. The water-soluble polymer layer plays a roll in promoting photoreduction in the subsequent UV exposure, and acts to improve the photocatalytic activity. Examples of suitable water-soluble polymeric compounds used herein include, but are not especially limited to, homopolymers, such as polyvinylalcohols, polyvinylphenols, polyvinylpyrrolidones, polyacrylic acids, polyacrylamides, gelatins, etc., and copolymers thereof. After the water-soluble polymeric compound in an amount of not higher than 30% is dissolved in water, the resulting solution is coated on the Ti-containing organic compound layer and heated to form the final photocatalyst layer.

Preferably, a photosensitizer may be added to the aqueous solution of the water-soluble polymeric compound in order to further increase the photosensitivity of the water-soluble polymer layer. As the photosensitizer, a water-soluble colorant, an organic acid, an organic acid salt, an organic amine, or the like can be used. Specific examples of the photosensitizer include tar colorants, potassium and sodium salts of chlorophylline, riboflavine and derivatives thereof, water-soluble annatto, $CuSO_4$, caramels, curcumine, cochineal, citric acid, ammonium citrate, sodium citrate, oxalic acid, potassium tartarate, sodium tartarate, ascorbic acid, formic acid, triethanolamine, monoethanolamine, malic acid, and the like. Thereafter, the water-soluble polymer layer is heated at a temperature of 80° C. or below for 5 minutes or less to evaporate water. The thickness of the final water-soluble polymer layer is preferably controlled to 0.1 μm or less.

ii) The Second Sub-Step: Formation of Latent Pattern Acting as Nucleus for Crystal Growth In this step, the photocatalytic film formed in the first sub-step is subjected to selective UV exposure to form a latent pattern acting as a nucleus for crystal growth thereon, which consists of active and inactive portions.

Exposure atmospherics and exposure dose are not especially limited, and can be properly selected according to the kind of the photocatalytic compound used.

As stated above, when the photocatalytic film is exposed to light, electrons present in the exposed portion are excited, thus allowing the photocatalytic compound to exhibit a reducing ability. Accordingly, reduction of the metal ions in the exposed portion takes place.

In this step, if necessary, the latent pattern acting as a nucleus for crystal growth thus formed may be dipped in a suitable metal salt solution to form a metal particle-deposited pattern thereon and completely remove the water-soluble polymer layer, in order to effectively form a metal pattern in subsequent step (iii). The deposited metal particles play a roll as catalysts accelerating growth of metal crystals in the subsequent plating process. When the latent pattern is to be plated with copper, nickel or gold, the treatment with the metal salt solution is preferred. As the metal salt solution, an Ag salt solution, a Pd salt solution, or a mixed solution thereof is preferably used.

iii) The Third Sub-Step: Formation of Metal Pattern by Growth of Metal Crystals

The latent pattern acting as a nucleus for crystal growth, or the metal particle-deposited pattern formed in the second sub-step is subjected to plating to grow metal crystals thereon, thereby forming a metal pattern. The plating is performed by an electroless or electroplating process.

In the case of the metal particle-deposited pattern formed by treating the latent pattern with a metal salt solution, since the metal particles, e.g., palladium or silver particles, exhibit sufficient activity as catalysts in an electroless plating solution, crystal growth is accelerated by plating and thus a more densely packed metal pattern can be advantageously formed.

The choice of suitable plating metals used for plating is determined according to the intended application of the metal pattern. The plating metal is preferably selected from the group consisting of Cu, Ni, Ag, Au and alloys thereof. To form a highly conductive metal pattern, a copper or silver compound solution is preferably used.

The electroless or electro-plating is achieved in accordance with well-known procedures. A more detailed explanation will be described below.

In the case where an electroless plating process is employed to grow copper crystals, the substrate on which the latent pattern acting as a nucleus for crystal growth is formed is dipped in a plating solution having a composition comprising 1) a copper salt, 2) a reducing agent, 3) a complexing agent, 4) a pH-adjusting agent, 5) a pH buffer, and 6) a modifying agent.

The copper salt 1) serves as a source providing copper ions to the substrate. Examples of the copper salt include copper chloride, copper sulfate and copper cyanide. Copper sulfate is preferred.

The reducing agent 2) acts to reduce metal ions present on the substrate. Specific examples of the reducing agent include $NaBH_4$, $KBH_4$, $NaH_2PO_2$, hydrazine, formalin, and polysaccharides (e.g., glucose). Formalin and polysaccharides (e.g, glucose) are preferred.

The complexing agent 3) functions to prevent precipitation of hydroxides in an alkaline solution and to control the concentration of free metal ions, thereby preventing the decomposition of metal salts and adjusting the plating speed. Specific examples of the complexing agent include ammonia solution, acetic acid, guanic acid, tartaric acid, chelating agents (e.g., EDTA), and organic amine compounds. Chelating agents such as EDTA are preferred. The pH-adjusting agent 4) plays a roll in adjusting the pH of the plating solution, and is selected from acidic or basic compounds. The pH buffer 5) inhibits a sudden change in the pH of the plating solution, and is selected from organic acids and weakly acidic inorganic compounds. The modifying agent 6) is a compound capable of improving coating and planarization characteristics. Specific examples of the modifying agent include common surfactants, and adsorptive substances capable of adsorbing components which interfere with the crystal growth.

In the case where an electroplating process is employed to grow copper crystals, the substrate on which the latent pattern is formed is dipped in a plating solution having a composition comprising 1) a copper salt, 2) a complexing agent, 3) a pH-adjusting agent, 4) a pH buffer and 5) a modifying agent. The functions and the specific examples of the components contained in the plating solution composition are as defined above.

In the case where an electroless plating process is employed to grow silver crystals, the substrate on which the latent pattern is formed is dipped in a plating solution having a composition comprising 1) a silver salt, 2) a reducing agent, 3) a complexing agent, 4) a pH-adjusting agent, 5) a pH buffer, and 6) a modifying agent. The silver salt 1) serves as a source providing silver ions to the metal pattern. Specific examples of the silver salt include silver chloride, silver nitrate and silver cyanide. Silver nitrate is preferred. The functions and the specific examples of the other components contained in the plating solution composition are as defined above.

In the case where an electro-plating process is employed to grow silver crystals, the substrate on which the latent pattern is formed is dipped in a plating solution having a composition comprising 1) a silver salt, 2) a complexing agent, 3) a pH-adjusting agent, 4) a pH buffer, and 5) a modifying agent. The functions and the specific examples of the components contained in the plating solution composition are as defined above.

2. Step 2: Transfer of Metal Pattern to Flexible Plastic Substrate

The metal pattern formed in step 1 is transferred to an adhesive-treated flexible plastic substrate to form a highly conductive metal pattern on the plastic substrate.

Preferred flexible plastic substrates usable in the present disclosure are made of transparent plastic materials, but are not particularly limited thereto. Non-limited examples of such transparent plastic materials include acrylic resins, polyesters, polycarbonates, polyethylenes, polyethersulfones, olefin maleimide copolymers, norbornene-based resins, etc. In the case where excellent heat resistance is required, olefin maleimide copolymers and norbornene-based resins are preferred. Otherwise, the use of polyester films, acrylic resins and the like is preferred. The kind of adhesives usable in the present disclosure is not specially limited, and common adhesives, such as transparent acrylic adhesives, can be used.

In accordance with the method of the present disclosure, the photocatalyst film remaining on the substrate after the transfer of the metal pattern to the flexible substrate can be recycled. Specifically, the substrate on which the photocatalyst film remains is returned to the second sub-step, and repeatedly used, thereby shortening the overall procedure and reducing the costs associated with formation of the highly conductive metal pattern.

The highly conductive metal pattern formed on the flexible plastic substrate by the method of the present disclosure can be used to manufacture EMI filters. In addition, the EMI filters can be employed in a variety of flat panel display devices, including PDPs and Organic Electroluminescence (EL) display devices. For example, the EMI filter of the present disclosure can be mounted within a filter assembly in such a manner as to shield electromagnetic waves generated by plasma luminescence and circuits of a plasma display device in operation.

EXAMPLES

Hereinafter, the present disclosure will be explained in more detail with reference to the following examples. However, these examples are given for purpose of illustrative discussion of the preferred embodiments of the present disclosure and are not to be construed as limiting the scope of the disclosure.

Formation Example 1

Formation of Latent Pattern

A solution of polybutyl titanate (2.5 wt %) in isopropanol was applied to a transparent glass substrate by spin coating, and was then dried at 150° C. for 5 minutes to obtain an amorphous $TiO_2$ film. At this time, the $TiO_2$ film was controlled to have a thickness of 30 mm to 100 nm. Thereafter, triethanol amine as a photosensitizer was added to an aqueous solution of 5 wt % of polyvinylalcohol (Mw: 25,000). At this time, the photosensitizer was used in an amount of 1% by weight, based on the weight of the polymer. The resulting mixture was stirred, coated on the $TiO_2$ film, and dried at 60° C. for 2 minutes. Next, UV light having a broad wavelength range was irradiated to the coated substrate through a photomask on which a fine mesh pattern was formed using a UV exposure system (Oriel, U.S.A). After the exposure, the substrate was dipped in a solution of $PdCl_2$ (0.6 g) and HCl (1 ml) in water (1 l) to deposit Pd particles on the surface of the exposed portion. As a result, a negative pattern composed of Pd, acting as a nucleus for crystal growth, was formed.

Example 1

Formation of Copper Pattern by Electroless Copper Plating

The substrate prepared in Formation Example 1 was dipped in an electroless copper plating solution to selectively grow crystals of a metal pattern. At this time, the copper plating solution was prepared so as to have a composition comprising 3.5 g of copper sulfate, 8.5 g of Rochelle salt as a complexing agent, 22 ml of formalin (37%) as a reducing agent, 1 g of thiourea as a stabilizer, 40 g of ammonia as another complexing agent, and 1 l of water. While maintaining the temperature of the copper plating solution at 35° C., the dipped substrate was subjected to electroless plating for 5 minutes to form a copper pattern thereon. The copper pattern was transferred to a PET film on which a transparent acrylic adhesive was coated. The basic physical properties of the copper pattern formed on the flexible PET film were measured, and the results are shown in Table 1 below.

Example 2

Formation of Silver Pattern by Electroless Silver Plating

The substrate prepared in Formation Example 1 was dipped in an electroless silver plating solution to selectively grow crystals of a metal pattern. At this time, the silver plating solution was prepared so as to have a composition comprising 4 g of silver nitrate, 45 g of glucose as a reducing agent, 4 g of Rochelle salt as a complexing agent, 1.5 g of polyvinylalcohol as another complexing agent, 100 ml of ethanol and 1 l of water. While maintaining the temperature of the silver plating solution at 40° C., the dipped substrate was subjected to electroless plating for 30 seconds to form a silver pattern thereon. The silver pattern was transferred to a PET film on which a transparent acrylic adhesive was coated. The basic physical properties of the silver pattern formed on the flexible PET film were measured, and the results are shown in Table 1 below.

Example 3

Formation of Metal Pattern Using Recovered Photocatalyst

After the copper pattern was transferred to the PET film in Example 1, the glass substrate on which the photocatalyst film remained was recovered. The polyvinylalcohol solution was coated on the recovered glass substrate. Thereafter, the procedure of Example 1 was repeated to form a copper pattern on a flexible PET film. The basic physical properties of the copper pattern thus formed were measured, and the results are shown in Table 1 below.

TABLE 1

| Example No. | Line width (μm) | Film thickness (μm) | Specific resistance (μΩ · cm) | Resolution (μm) | Adhesive force | Electromagnetic wave shielding effect |
| --- | --- | --- | --- | --- | --- | --- |
| Example 1 | 10 | 0.3 | 8 | <5 | Excellent | Excellent |
| Example 2 | 10 | 0.1 | 7 | <5 | Excellent | Excellent |
| Example 3 | 10 | 0.1 | 7 | <5 | Excellent | Excellent |

[Methods for Evaluation of Physical Properties]

The thickness of the layers was measured using alpha-step (manufactured by Dektak).

The specific resistance was measured using a 4-point probe.

The resolution was determined using an optical microscope.

The adhesive force was evaluated by a scotch tape peeling test.

The electromagnetic wave shielding effect was evaluated by measuring the transmittance of an electromagnetic wave having a frequency range of 30 MHz to 1,000 MHz.

As apparent from the above description, the present disclosure provides an effective method for forming a highly conductive metal pattern within a short time by forming a photocatalytic thin film on a substrate by a simple coating process, followed by simply plating the thin film. The method of the present disclosure avoids the use of sputtering, photo-patterning using photosensitive resins and etching processes requiring high vacuum conditions. In addition, the ESI filter manufactured using a metal pattern formed by the method not only exhibits high performances comparable to conventional EMI filters, but also is advantageous in terms of low manufacturing costs and simple manufacturing process. Furthermore, according to the method of the present disclosure, since the photocatalyst film remaining on the substrate after transfer of the metal pattern to the flexible plastic substrate can be recycled, the overall procedure can be shortened and the costs for production can be reduced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a highly conductive metal pattern on a flexible plastic substrate, comprising the steps of:
    forming a latent pattern acting as a nucleus for crystal growth on a base substrate, and growing initial metal crystals on the latent pattern by plating to form a metal pattern;
    transferring the metal pattern to a first adhesive-treated flexible plastic substrate; wherein the step of forming a metal pattern includes the sub-steps of:
        coating a photocatalytic compound on the base substrate to form a photocatalytic film, wherein the photocatalytic compound is a Ti-containing organic compound forming a water-soluble polymer layer on the Ti-containing organic compound layer;
        selectively exposing the photocatalytic film to light to form a latent pattern acting as a nucleus for crystal growth; and
        growing metal crystals on the latent pattern by plating the latent pattern to form the metal pattern; and
    growing additional metal crystals on the latent pattern to form another metal pattern for transfer to a second adhesive-treated flexible plastic substrate.

2. The method according to claim 1, wherein the growing of the additional metal crystals comprises using the same photocatalytic film and the same substrate for growing the additional metal crystals as for use in growing the initial metal crystals.

3. The method according to claim 1, wherein the plating of the third sub-step is performed by an electroless or electroplating process, and the plating metal is selected from the group consisting of Ni, Cu, Ag, Au and alloys thereof.

4. The method according to claim 2, wherein the plating of the third sub-step is performed by an electroless or electroplating process, and the plating metal is selected from the group consisting of Ni, Cu, Ag, Au and alloys thereof.

5. An EMI filter comprising a metal pattern formed by the method according to claim 1.

6. A flat panel display device comprising the EMI filter according to claim 5.

7. The method according to claim 1, wherein Ti-containing organic compound is selected from a group consisting of tetraisopropyl titanate, tetra-n-butyl titanate, tetrakis (2-ethylhexyl) titanate, and polybutyl titanate.

8. A method for forming a highly conductive metal pattern on a flexible plastic substrate, comprising the steps of:
    forming a latent pattern acting as a nucleus for crystal growth on a base substrate, and growing initial metal crystals on the latent pattern by plating to form a metal pattern;
    transferring the metal pattern to a first adhesive-treated flexible plastic substrate; wherein the step of forming a metal pattern includes the sub-steps of:
        coating a photocatalytic compound on the base substrate to form a photocatalytic film, wherein the photocatalytic compound is a Ti-containing organic compound forming a water-soluble polymer layer on the Ti-containing organic compound layer;
        selectively exposing the photocatalytic film to light to form a latent pattern acting as a nucleus for crystal growth; and
        growing metal crystals on the latent pattern by plating the latent pattern to form the metal pattern;
    growing additional metal crystals on the latent pattern to form another metal pattern for transfer to a second adhesive-treated flexible plastic substrate; and
    treating the latent pattern acting as a nucleus for crystal growth with a metal salt solution to form a metal particle-deposited pattern thereon and completely remove the water-soluble polymer layer.

9. A method for forming a highly conductive metal pattern on a flexible plastic substrate, comprising the steps of:
    forming a latent pattern acting as a nucleus for crystal growth on the substrate, and growing metal crystals on the latent pattern by plating to form a metal pattern;
    transferring the metal pattern to an adhesive-treated flexible plastic substrate, wherein the step of forming a metal pattern includes the sub-steps of:
        coating a photocatalytic compound on the substrate to form a photocatalytic film,
        selectively exposing the photocatalytic film to light to form a latent pattern acting as a nucleus for crystal growth, and
        growing metal crystals on the latent pattern by plating the latent pattern to form the metal pattern, and wherein the photocatalytic compound is a Ti-containing organic compound;
    forming a water-soluble polymer layer on the Ti-containing organic compound layer; and
    treating the latent pattern acting as a nucleus for crystal growth with a metal salt solution to form a metal particle-deposited pattern thereon and completely remove the water-soluble polymer layer, wherein the metal salt solution is a palladium salt solution, a silver salt solution, or a mixed solution thereof.

10. A method for forming a highly conductive metal pattern on a flexible plastic substrate, comprising the steps of:
    forming a latent pattern acting as a nucleus for crystal growth on the substrate, and growing metal crystals on the latent pattern by plating to form a metal pattern;
    transferring the metal pattern to an adhesive-treated flexible plastic substrate, wherein the step of forming a metal pattern includes the sub-steps of:
        coating a photocatalytic compound on the substrate to form a photocatalytic film,
        selectively exposing the photocatalytic film to light to form a latent pattern acting as a nucleus for crystal growth, and
        growing metal crystals on the latent pattern by plating the latent pattern to form the metal pattern; and
    returning the substrate on which the photocatalytic film remains after the transfer of the metal pattern to the adhesive-treated plastic substrate to the second sub-step.

11. A method for forming a highly conductive metal pattern on a flexible plastic substrate, comprising the steps of:
- forming a latent pattern acting as a nucleus for crystal growth on the substrate, and growing metal crystals on the latent pattern by plating to form a metal pattern;
- transferring the metal pattern to an adhesive-treated flexible plastic substrate, wherein the step of forming a metal pattern includes the sub-steps of:
  - coating a photocatalytic compound on the substrate to form a photocatalytic film;
  - selectively exposing the photocatalytic film to light to form a latent pattern acting as a nucleus for crystal growth, and
  - growing metal crystals on the latent pattern by plating the latent pattern to form the metal pattern, wherein the photocatalytic compound is a Ti-containing organic compound; and
- returning the substrate on which the photocatalytic film remains after the transfer of the metal pattern to the adhesive-treated plastic substrate to the second sub-step.

12. A method for forming a highly conductive metal pattern on a flexible plastic substrate, comprising the steps of:
- forming a latent pattern acting as a nucleus for crystal growth on the substrate, and growing metal crystals on the latent pattern by plating to form a metal pattern;
- transferring the metal pattern to an adhesive-treated flexible plastic substrate, wherein the step of forming a metal pattern includes the sub-steps of:
  - coating a photocatalytic compound on the substrate to form a photocatalytic film;
  - selectively exposing the photocatalytic film to light to form a latent pattern acting as a nucleus for crystal growth; and
  - growing metal crystals on the latent pattern by plating the latent pattern to form the metal pattern, wherein the photocatalytic compound is a Ti-containing organic compound, wherein the photocatalytic compound is a Ti-containing organic compound; and
  - forming a water-soluble polymer layer on the Ti-containing organic compound layer; and
- adding a photosensitizer selected from the group consisting of water-soluble colorants, organic acids, organic acid salts and organic amines to a resin for the water-soluble polymer layer.

13. A method for recycling photocatalytic film on a substrate used in forming a metal pattern on a plastic substrate, comprising:
- forming a photocatalytic film on a substrate;
- forming a water-soluble polymer layer on the photocatalytic film;
- patterning the water-soluble polymer layer;
- depositing metal particles on the photocatalytic layer between patterned portions of the water-soluble polymer layer;
- plating the metal particles to form a metal pattern;
- transferring the metal pattern onto a plastic substrate; and
- recycling the photocatalytic film remaining on the substrate.

14. The method according to claim 13, wherein the recycling the photocatalytic film remaining on the substrate comprises:
- providing the photocatalytic film remaining on the substrate;
- forming a water-soluble polymer layer on the photocatalytic film;
- patterning the water-soluble polymer layer;
- depositing metal particles on the photocatalytic layer between patterned portions of the water-soluble polymer layer;
- removing the water-soluble polymer layer;
- plating the metal particles to form a metal pattern; and
- transferring the metal pattern onto a plastic substrate.

15. The method according to claim 13, wherein the recycling the photocatalytic film remaining on the substrate comprises re-using the same photocatalytic film and the same substrate for forming an additional metal pattern on a plastic substrate.

16. The method according to claim 15, wherein plating the metal particles to form a metal pattern comprises dipping the substrate into a plating solution of a metal salt, a complexing agent, a pH-adjusting agent, a pH buffer, and a modifying agent.

17. The method according to claim 13, wherein the photocatalytic film is a Ti-containing organic film.

18. The method according to claim 17, wherein Ti-containing organic compound is selected from a group consisting of tetraisopropyl titanate, tetra-n-butyl titanate, tetrakis (2-ethylhexyl) titanate, and polybutyl titanate, and wherein the method further includes forming a water-soluble polymer layer on the Ti-containing organic compound layer.

* * * * *